(12) United States Patent
Takenaka et al.

(10) Patent No.: US 7,936,570 B2
(45) Date of Patent: May 3, 2011

(54) LIQUID CRYSTAL DISPLAY DEVICE

(75) Inventors: Yuuichi Takenaka, Chiba (JP);
Hiromitsu Sato, Mobara (JP); Takanori Sato, Chiba (JP); Kazumi Akiba, Ooamishirasato (JP); Yoshihiro Kazuma, Katsuura (JP)

(73) Assignees: Hitachi Displays, Ltd., Chiba-ken (JP); IPS Alpha Technology, Ltd., Chiba-ken (JP)

( * ) Notice: Subject to any disclaimer, the term of this patent is extended or adjusted under 35 U.S.C. 154(b) by 515 days.

(21) Appl. No.: 12/073,950

(22) Filed: Mar. 12, 2008

(65) Prior Publication Data

US 2008/0253101 A1 Oct. 16, 2008

(30) Foreign Application Priority Data

Mar. 19, 2007 (JP) .................................. 2007-070564

(51) Int. Cl.
*H05K 1/11* (2006.01)
(52) U.S. Cl. .......................... 361/803; 361/749; 257/797
(58) Field of Classification Search .................. 361/803, 361/749; 257/797
See application file for complete search history.

(56) References Cited

U.S. PATENT DOCUMENTS 6,894,758 B1 * 5/2005 Hagiwara et al. ............. 349/152
6,961,110 B2 * 11/2005 Ogawa et al. ................. 349/150

FOREIGN PATENT DOCUMENTS

| CN | 1849855 A | 5/2004 |
|---|---|---|
| JP | 05-90722 | 7/1991 |
| JP | 2005-086042 | 9/2003 |
| WO | PCT/JP2004/006668 | 5/2004 |

* cited by examiner

*Primary Examiner* — Yuriy Semenenko
*Assistant Examiner* — Andargie M Aychillhum
(74) *Attorney, Agent, or Firm* — Stites & Harbison PLLC; Juan Carlos A. Marquez, Esq.

(57) ABSTRACT

The present invention provides a liquid crystal display device which can establish the reliable connection between a printed circuit board and a semiconductor device in spite of the simple constitution thereof. The liquid crystal display device includes a liquid crystal display panel, a printed circuit board arranged close to the liquid crystal display panel, and a semiconductor device arranged between the liquid crystal display panel and the printed circuit board in a striding manner. The semiconductor device includes a flexible printed circuit board and a semiconductor chip. The flexible printed circuit board includes a plurality of first terminals connected to the printed circuit board and a plurality of second terminals connected to a liquid-crystal-display-panel side. The printed circuit board includes a solder resist film, an opening portion formed in the solder resist film, and a terminal portion arranged in the opening portion and consisting of a plurality of terminals connected to the first terminals of the flexible printed circuit board. The terminal portion of the printed circuit board and the first terminals of the semiconductor device are connected with each other by way of an anisotropic conductive film. The anisotropic conductive film overlaps with at least the respective terminals of the terminal portion of the printed circuit board and the solder resist film.

8 Claims, 5 Drawing Sheets

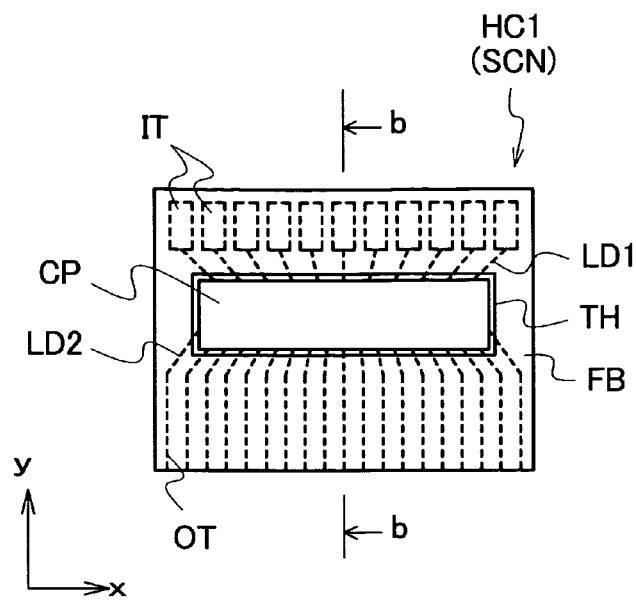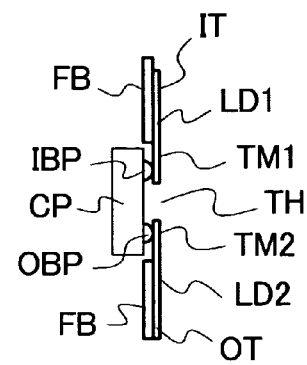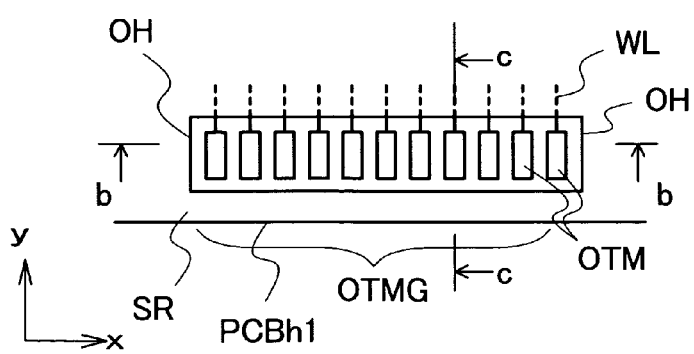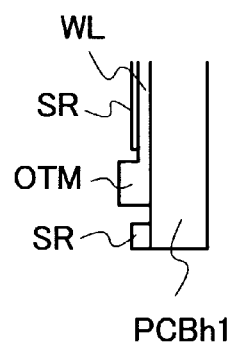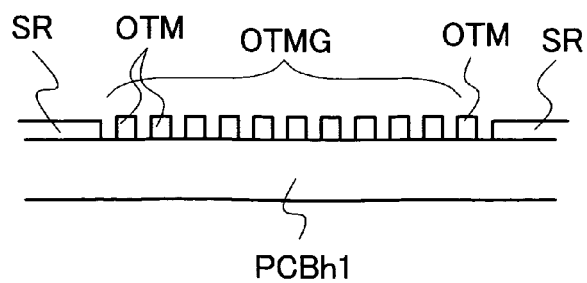

LIQUID CRYSTAL DISPLAY DEVICE

The present application claims priority from Japanese application JP2007-070564 filed on Mar. 19, 2007, the content of which is hereby incorporated by reference into this application.

BACKGROUND OF THE INVENTION

1. Field of the Invention

The present invention relates to a liquid crystal display device, and more particularly to a liquid crystal display device which includes a semiconductor device formed by a film carrier method as a display drive circuit in a liquid crystal display panel.

2. Description of the Related Art

In this type of liquid crystal display device, a printed circuit board is arranged close to a liquid crystal display panel, and a semiconductor device is arranged between the liquid crystal display panel and a printed circuit board in a striding manner.

The semiconductor device is formed by a film carrier method, and a semiconductor chip is mounted on a flexible printed circuit board. Further, on the flexible printed circuit board, a line layer which leads a signal from an input terminal connected to a printed-circuit-board-side terminal to an output terminal connected to a liquid-crystal-display-panel-side terminal by way of the semiconductor chip is formed.

Then, the semiconductor device (flexible printed circuit board) is connected to the printed circuit board and the liquid crystal display panel respectively by thermo compression bonding by way of an anisotropic conductive film. With the use of the anisotropic conductive film, the electrical connection between respective input terminals of the flexible printed circuit board and respective terminals of the printed circuit board connected to the input terminals is established, and the electrical connection between respective output terminals of the flexible printed circuit board and respective terminals of the liquid crystal display panel connected to the output terminals is established. Further, the mechanical connection among the semiconductor device, the printed circuit board and the liquid crystal display panel is also established.

Here, for example, to take a step for performing the above-mentioned connection between the printed circuit board and the semiconductor device (flexible printed circuit board) as an example, first of all, the anisotropic conductive film is laminated and temporarily fixed to the printed circuit board such that the anisotropic conductive film covers respective terminals arranged in a juxtaposed manner and, then, the positioning of the flexible printed circuit board to the printed circuit board is performed. Thereafter, the flexible printed circuit board is adhered and thermally bonded to the printed circuit board by way of the anisotropic conductive film.

The liquid crystal display device having such a constitution is disclosed in the patent document 1 (JP-A-2004-6632 (corresponding U.S. Pat. No. 7,012,814B2)), for example.

SUMMARY OF THE INVENTION

In the liquid crystal display device having the above-mentioned constitution, to enhance the reliability of connection between the printed circuit board and the semiconductor device particularly, it is necessary to temporarily fix the anisotropic conductive film arranged to cover the respective terminals to the printed circuit board without failures.

As the temporary fixing failures of the anisotropic conductive film, curling attributed to peeling-off of an end portion, partial or whole-surface chipping and the like are named. When these failures occur, at least one of the electrical connection and the mechanical bonding between the terminals of the printed circuit board and the terminals of the semiconductor device becomes defective.

To cope with such failures, as described in patent document 1, for example, there has been proposed a countermeasure in which, out of the respective terminals arranged in parallel on the printed circuit board, the terminals arranged on both sides are allowed to have a large width. Alternatively, there has been proposed a countermeasure in which, a dummy terminal having a plurality of openings is arranged on one end side of the respective terminals arranged in parallel on the printed circuit board. That is, an adhesive strength of the anisotropic conductive film is increased at width-increased terminals or dummy terminals.

However, all these countermeasures make the formation of terminals of the printed circuit board complicated. Further, the adhesion of only the anisotropic conductive film and the terminal portions cannot noticeably increase the adhesiveness. Accordingly, there has been a demand for the constitution which can establish the reliable connection between the printed circuit board and the semiconductor device with the simpler constitution.

Accordingly, it is an object of the present invention to provide a liquid crystal display device which can establish the reliable connection between a printed circuit board and a semiconductor device in spite of the simple constitution thereof.

Among the inventions disclosed in this specification, to briefly explain the summary of the typical inventions, they are as follows.

A liquid crystal display device of the present invention includes: a liquid crystal display panel; a printed circuit board arranged close to the liquid crystal display panel; and a semiconductor device arranged between the liquid crystal display panel and the printed circuit board in a striding manner, wherein the semiconductor device includes a flexible printed circuit board and a semiconductor chip, the flexible printed circuit board includes a plurality of first terminals connected to the printed circuit board and a plurality of second terminals connected to a liquid-crystal-display-panel side, the printed circuit board includes a solder resist film, an opening portion formed in the solder resist film, and a terminal portion arranged in the opening portion and consisting of a plurality of terminals connected to the first terminals of the flexible printed circuit board, the terminal portion of the printed circuit board and the first terminals of the semiconductor device are connected with each other by way of an anisotropic conductive film, and the anisotropic conductive film overlaps with at least the respective terminals of the terminal portion of the printed circuit board and the solder resist film.

The present invention is not limited to the above-mentioned constitutions and various modifications are conceivable without departing from a technical concept of the present invention.

According to the above-mentioned liquid crystal display device, the reliable connection between the printed circuit board and the semiconductor device can be realized in spite of the simple constitution.

BRIEF DESCRIPTION OF THE DRAWINGS

FIG. 3A and FIG. 3B are constitutional views showing the embodiment of a semiconductor device provided to the liquid crystal display device of the present invention;

FIG. 4A to FIG. 4C are constitutional views showing the embodiment of a printed circuit board provided to the liquid crystal display device of the present invention;

DESCRIPTION OF THE PREFERRED EMBODIMENTS

Hereinafter, embodiments of a liquid crystal display device according to the present invention are explained in conjunction with drawings.
(Overall Constitution)

Figure 2A:
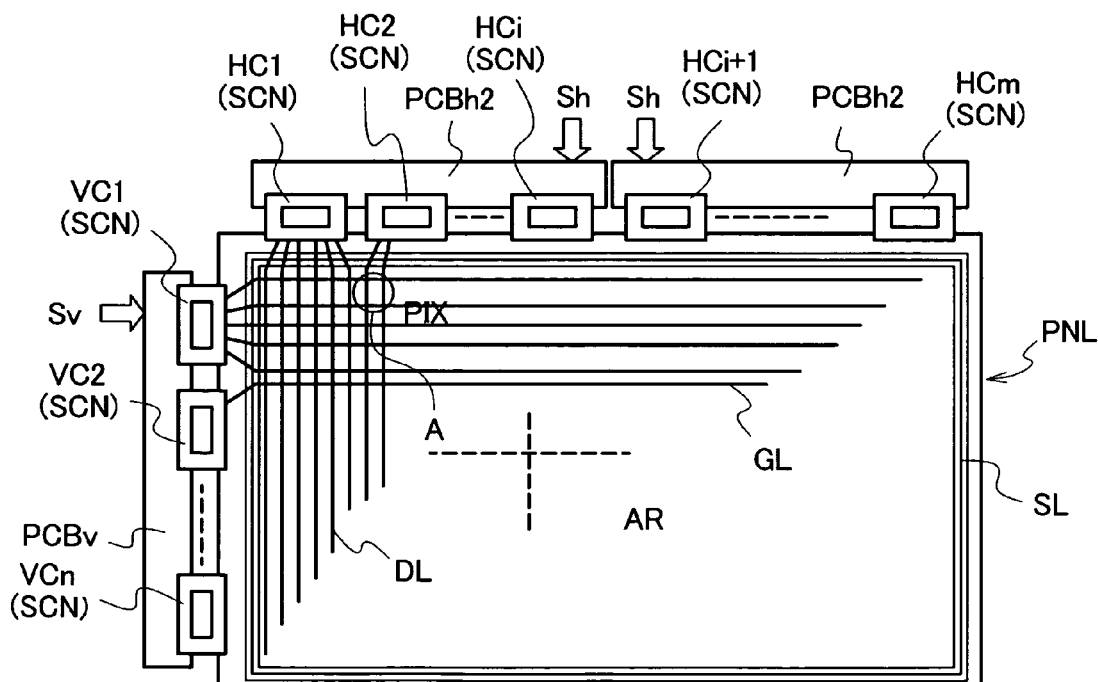
FIG. 2 is a schematic plan view showing the embodiment of the liquid crystal display device of the present invention.
Figure 2B:
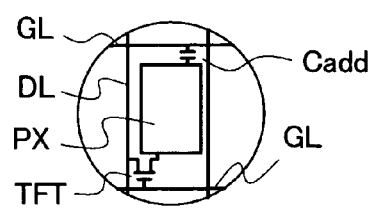

FIG. 2 is a schematic plan view showing one embodiment of the liquid crystal display device according to the present invention.

First of all, the liquid crystal display device includes a liquid crystal display panel PNL which is constituted of an envelope formed of a substrate SUB1 and a substrate SUB2 which are arranged to face each other in an opposed manner with liquid crystal (not shown in the drawing) sandwiched therebetween.

The liquid crystal is sealed using a sealing material SL which also performs a function of fixing the substrate SUB2 to the substrate SUB1, and a region which is surrounded by the sealing material SL constitutes a liquid crystal display region AR.

On a liquid-crystal-side surface of the substrate SUB1, for example, within the liquid crystal display region AR, respective gate signal lines GL which extend in the x direction in the drawing and are arranged parallel to each other in the y direction, and respective drain signal lines DL which extend in the y direction and are arranged in parallel to each other in the x direction are formed.

A pixel is formed in each region (pixel region) surrounded by the neighboring respective gate signal lines GL and the neighboring respective drain signal lines DL. Accordingly, respective pixels are arranged in a matrix array in the liquid crystal display region AR.

As shown in an enlarged view (a view surrounded by a circular frame indicated by a solid line in the drawing) showing a portion (a portion within a circular frame indicated by a dotted line in the drawing) indicated by symbol PIX in the drawing, for example, as an equivalent circuit, the pixel is configured as follows. That is, the pixel includes a thin film transistor TFT which is turned on in response to a signal (scanning signal) from the gate signal line GL, a pixel electrode PX to which a signal (video signal) from the drain signal line DL is supplied via the thin film transistor TFT, and a capacitance element Cadd which is connected between the pixel electrode PX and another gate signal line GL with the pixel electrode PX arranged between the gate signal line GL for driving the pixel electrode PX and the thin film transistor TFT and another gate signal line GL.

The capacity element Cadd is provided for storing a charge of a video signal for a relatively long time when the video signal is supplied to the pixel electrode PX. Further, the pixel electrodes PX are configured to generate electric fields between the pixel electrodes PX and a counter electrode (not shown in the drawing) provided in common to the respective pixel regions by way of the liquid crystal on a liquid-crystal-side surface of the substrate SUB2.

On one left end in the drawing, for example, the gate signal lines GL extend while getting over the sealing material SL, and are connected to scanning signal drive circuits VC1, VC2, . . . , VCn arranged on a left peripheral side of the substrate SUB1. When these scanning signal drive circuits VC1, VC2, . . . , VCn are driven, the scanning signal is sequentially supplied to the respective gate signal lines GL in order from the gate signal line GL on an uppermost stage to the gate signal line GL on a lowermost stage in the drawing, for example, and such an operation is repeated.

Further, on one upper end in the drawing, for example, the drain signal lines DL extend while getting over the sealing material SL, and are connected to video signal drive circuits HC1, HC2, . . . , HCm arranged on an upper peripheral side of the substrate SUB1. When these video signal drive circuits HC1, HC2, . . . , HCm are driven, the video signal is supplied to the respective drain signal lines DL. In this case, the video signal is supplied to the video signal lines at timing that the scanning signal is supplied to the respective gate signal lines GL from the scanning signal drive circuits VC1, VC2, . . . , VCn.

The scanning signal drive circuits VC1, VC2, . . . , VCn are respectively constituted of a semiconductor device SCN formed by a so-called tape carrier method, and are arranged between the liquid crystal display panel PNL and a printed circuit board PCBv arranged close to the liquid crystal display panel PNL in a striding manner.

Although the detailed explanation is made later in conjunction with FIG. 3, the semiconductor device SCN is configured such that a semiconductor chip is mounted on a flexible printed circuit board, and the flexible printed circuit board includes line layers which supply a signal from terminals on a printed-circuit-board side to terminals on a liquid-crystal-display-panel side via the semiconductor chip.

A signal Sv from a control circuit (T-con) not shown in the drawing is supplied to the printed circuit board PCBv, and an output signal acquired after the signal Sv passes through a circuit (not shown in the drawing) arranged on the printed circuit board PCBv is inputted to terminals (input terminals) of the scanning signal drive circuits VC1, VC2, . . . , VCn.

In the same manner as the scanning signal drive circuits VC1, VC2, . . . , VCn, the video signal drive circuits HC1, HC2, . . . , HCm are also respectively constituted of a semiconductor device SCN formed by a tape carrier method, and are arranged between the liquid crystal display panel PNL and printed circuit boards PCBh1, PCBh2 arranged close to the liquid crystal display panel PNL in a striding manner.

A signal Sh from the control circuit (T-con) is supplied to the printed circuit boards PCBh1, PCBh2, and an output signal obtained after the signal Sh passes through circuits (not shown in the drawing) arranged on the printed circuit boards PCBh1, PCBh2 is inputted to terminals (input terminals) of the video signal drive circuits HC1, HC2, . . . , HCm.

Here, in FIG. 2, two printed circuit boards PCBh1, PCBh2 are arranged along the direction that the drain signal lines are arranged parallel to each other. This is because the present invention intends to be applied to a liquid crystal display device having a large-sized display panel PNL. Accordingly, out of the video signal drive circuits HC1, HC2 ..., HCm, the video signal drive circuits HC1, ..., HCi, are connected to the printed circuit boards PCBh1, while the video signal drive circuits HCi+1, ..., HCm are connected to the printed circuit boards PCBh2. The printed circuit boards PCBh1, PCBh2 may be constituted of one printed circuit board or three or more printed circuit boards.

The liquid crystal display panel PNL and the like having the above-mentioned constitution are formed into a module together with a backlight and the like, for example, using a frame. In forming the liquid crystal display panel PNL and the like into the module, the semiconductor devices SCN are bent at a portion of the flexible printed circuit board so as to arrange the printed circuit boards PCBv, PCBh1, PCBh2 and the like on a back surface of the liquid crystal display panel PNL thus realizing so-called narrow picture framing.

In the liquid crystal display device to which the present invention is applicable, the constitution of the pixel is not limited to the above-mentioned constitution. For example, the present invention is applicable to the so-called IPS-method pixel constitution in which pixel electrodes and counter electrodes are formed on a pixel region on a substrate SUB1 side, and liquid crystal is driven by electric field generated between the respective electrodes.

(Semiconductor Device)

FIG. 3A and FIG. 3B are a constitutional view showing the constitution in appearance of the semiconductor device SCN constituting each one of the respective scanning signal drive circuits VC1, VC2, ..., VCn and video signal drive circuits HC1, HC2, ..., HCm. For example, out of these scanning signal drive circuits and video signal drive circuits, the video signal drive circuit HC1 is shown in FIG. 3 as an example.

FIG. 3A is a plan view of the semiconductor device SCN, and FIG. 3B is a cross-sectional view taken along a line b-b in FIG. 3A.

As described above, the semiconductor device SCN is formed by a tape carrier method. A semiconductor chip CP is mounted on an approximately center portion of the flexible printed circuit board FB made of a resin material. On the flexible printed circuit board FB, a plurality of input terminals IT connected to the terminals on a printed-circuit-board-PCBh1 side (shown with a symbol OTM in FIG. 4), a plurality of output terminals OT connected to the terminals on a liquid-crystal-display-panel-PNL side, and leads (line layers) LD1, LD2 which lead signals from the input terminals IT to the output terminals OT via the semiconductor chip CP are formed.

The input terminals IT, the output terminals OT and the leads LD1, LD2 are respectively formed, for example, on a surface of the flexible printed circuit board FB opposite to a side of the flexible printed circuit board FB where the semiconductor chip CP is mounted.

In a region of the flexible printed circuit board FB on which the semiconductor chip CP is mounted, through holes TH are formed. Further, distal ends of the leads LD1 connected to the respective input terminals IT are formed to project into the inside of the through holes TH, and the projecting portions of the leads LD1 constitute terminals TM1 connected to respective input bumps IBP of the semiconductor chip CP. Further, distal ends of the leads LD2 connected to the respective output terminals OT are formed to project into the inside of the through holes TH and the projecting portions of the leads LD2 constitute terminals TM2 connected to respective output bumps OBP of the semiconductor chip CP.

The semiconductor chip CP is mounted on a surface of the flexible printed circuit board FB opposite to the side of the flexible printed circuit board FB where the input terminals IT, the output terminals OT, and the leads LD1, LD2 are formed, for example, the input bumps IBP are connected to the terminals TM1 of the leads LD1 via solder, and the output bumps OBP are connected to the terminals TM2 of the leads LD2 via solder.

Here, although a resin material is applied to the flexible printed circuit board FB on the side on which the semiconductor chip CP is mounted in a state that the resin material covers the semiconductor chip CP, the resin material is not shown in FIG. 3.

(Printed Circuit Board)

FIG. 4A to FIG. 4C are constitutional views of the printed circuit board PCBh1 connected to the video signal drive circuit HC1. These drawings show terminals (terminal group) which are respectively connected to the input terminals IT of the video signal drive circuit HC1.

FIG. 4A is a plan view of the printed circuit board PCBh1, FIG. 4B is a cross-sectional view taken along a line b-b in FIG. 4A, and FIG. 4C is a cross-sectional view taken along a line c-c in FIG. 4A.

As shown in FIG. 4A, the terminals OTM of the printed circuit board PCBh1 are configured as the terminal group OTMG constituted of the terminals which are arranged parallel to each other respectively corresponding to the input terminals IT of the video signal drive circuit HC1.

The respective terminals OTM are formed on distal ends of line layers WL formed on the printed circuit board PCBh1, and are made of the same material as the line layers WL. A solder resist film SR is formed on a surface of the printed circuit board PCBh1, and the terminals OTM are arranged in the inside of an opening OH formed in the solder resist film SR. Further, the terminal OTM is sequentially plated with nickel and gold, for example, and a layer thickness is set to approximately 35 μm, for example.

Here, although not shown in the drawing, electric parts such as capacitors are mounted on the printed circuit board PCBh1, and signals Sh from terminals (not shown in the drawing) connected to the control circuit (T-con) are supplied to the terminals OTM via the electric parts by the line layers WL.

Further, on a surface of the printed circuit board PCBh1 on which the line layers WL and the terminal group OTMG consisting of the respective terminals OTM are formed, and the solder resist film SR which covers at least the surrounding of the terminal group OTMG is applied to the surface of the printed circuit board PCBh1 while exposing the terminal group OTMG. That is, in the solder resist film SR which is formed to cover the surface of the printed circuit board PCBh1, the opening OH which exposes the terminal group OTMG is formed with a profile which surrounds the terminal group OTMG.

The solder resist film SR exhibits the higher adhesiveness with an anisotropic conductive film ACF than the printed circuit board PCBh1 and the terminal OTM and hence, the solder resist film SR also has a function of temporarily fixing the anisotropic conductive film ACF with sufficient reliability.

(Anisotropic Conductive Film)

Figure 5A:
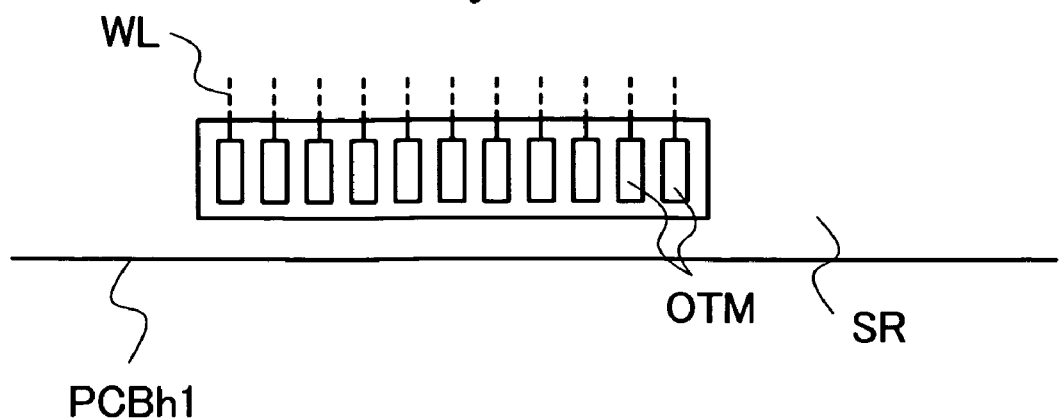
FIG. 5A to FIG. 5C are exploded plan views showing the printed circuit board, the anisotropic conductive film and the semiconductor device.
Figure 5B:
Figure 5C:
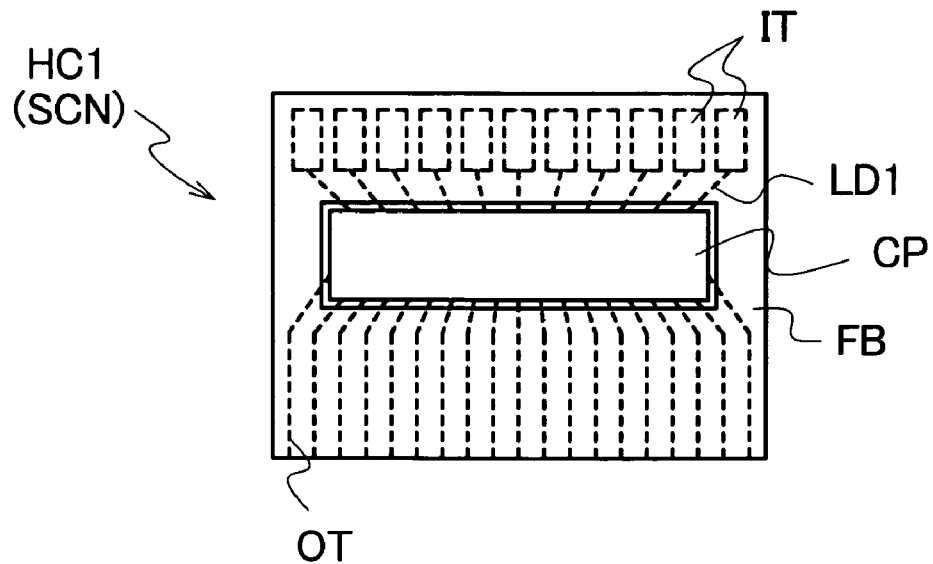

FIG. 5A is a plan view showing a portion of the terminal group consisting of the respective terminals OTM on the printed circuit board PCBh1, FIG. 5B is a plan view of the anisotropic conductive film ACF, and FIG. 5C is a plan view of a semiconductor device SCN.

FIG. 5A to FIG. 5C show the printed circuit board PCBh1, the anisotropic conductive film ACF and the semiconductor device SCN which are originally arranged in a stacked manner in an independently arranged manner.

The anisotropic conductive film ACF is formed by mixing a large number of conductive particles in a film made of a resin. The resin is made of an adhesive agent which contains an epoxy adhesive agent, for example, as a main component, while the conductive particles are formed of particles which are produced by sequentially plating nickel and gold on plastic particles having a particle size of 5 μm, for example.

Due to such a constitution, by stacking the printed circuit board PCBh1, the anisotropic conductive film ACF and the semiconductor device SCN and by pressing (thermo-pressure bonding) the semiconductor device SCN to the printed circuit board PCBh1 while healing the anisotropic conductive film ACF, the anisotropic conductive film ACF can establish the mechanical connection between the printed circuit board PCBh1 and the semiconductor layer SCN and, at the same time, can establish the electric connection between the terminals OTM of the printed circuit board PCBh1 and input terminals IT of the semiconductor device SCN.

Figure 6A:
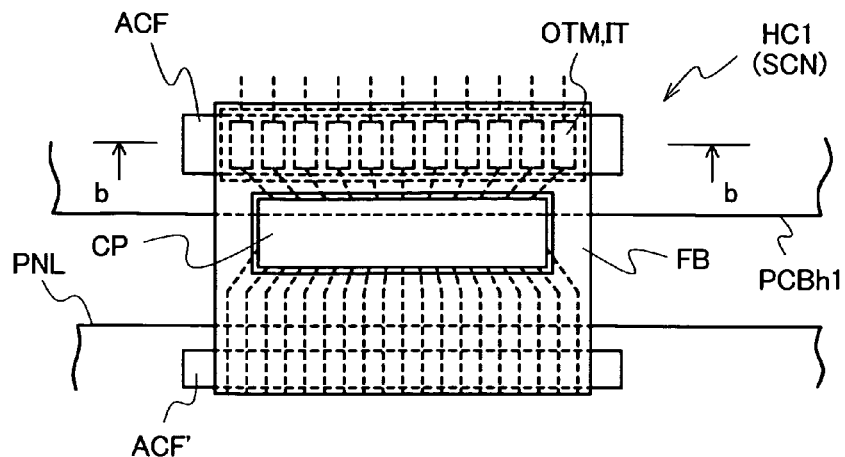
FIG. 6A and FIG. 6B are constitutional views showing the printed circuit board, the anisotropic conductive film and the semiconductor device in a sequentially stacked manner.
Figure 6B:
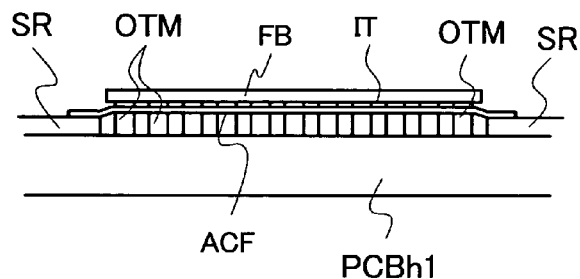

Here, FIG. 6A is a plan view showing a state that the printed circuit board PCBh1, the anisotropic conductive film ACF and the semiconductor device SCN are sequentially stacked and arranged such that the respective terminals OTM of the printed circuit board PCBh1 and the respective input terminals IT of the semiconductor device SCN face each other. In FIG. 6, such sequentially stacked structure is depicted in a see-through manner. Further, FIG. 6B is a cross-sectional view taken along a line b-b in FIG. 6A.

The respective terminals OTM of the printed circuit board PCBh1 and the respective input terminals IT of the semiconductor device SCN arranged to face these respective terminals OTM in an opposed manner are positioned within the anisotropic conductive film ACF. That is, the respective terminals OTM and the respective input terminals IT are arranged in a state that portions of the terminals OTM and the input terminals IT are prevented from being positioned outside the anisotropic conductive film ACF. This arrangement is adopted, as described later, for temporarily fixing the anisotropic conductive film ACF with reliability after accurately arranging the anisotropic conductive film ACF with respect to the printed circuit board PCBh1.

Further, FIG. 6A also shows the use of an anisotropic conductive film ACF' for connecting the semiconductor device SCN and the liquid-crystal-display-panel-PNL side. However, in addition to a structural advantage that respective terminals formed on the liquid crystal display panel PNL (respective terminals to be connected to output terminals of the semiconductor device SCN) exhibit small surface stepped portions (for example, approximately 0.3 μm) compared to other portions of the liquid crystal display panel PNL, the adhesiveness between the anisotropic conductive film ACF' and the liquid crystal display panel PNL is favorable in many cases and hence, the reliability of temporary fixing of the anisotropic conductive film ACF' to the liquid crystal display panel PNL is relatively favorable. Accordingly, in this embodiment, a connection mode between the liquid crystal display panel PNL and the semiconductor device SCN with the anisotropic conductive film ACF' interposed therebetween adopts the conventional constitution.

Figure 1:
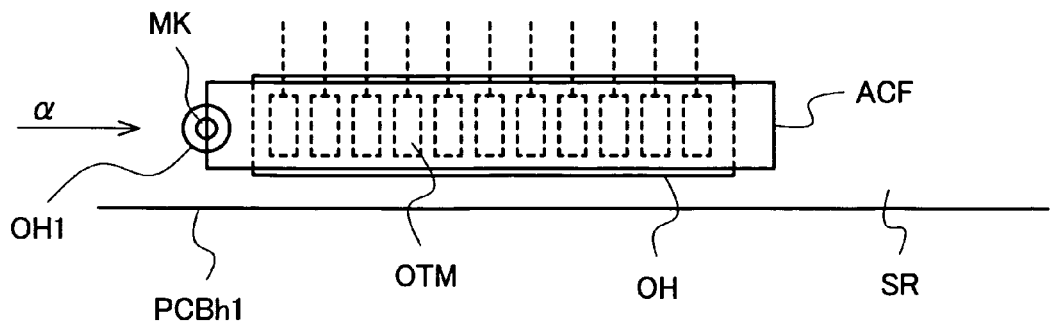
FIG. 1 is a constitutional view of an essential part showing one embodiment of a liquid crystal display device of the present invention showing a printed circuit board provided to the liquid crystal display device and an anisotropic conductive film temporarily fixed to the printed circuit board.

FIG. 1 is a plan view showing a state in which the anisotropic conductive film ACF is temporarily fixed to the printed circuit board PCBh1 as a stage prior to a step for compression-bonding the semiconductor device SCN to the printed circuit board PCBh1 with the anisotropic conductive film ACF interposed therebetween.

The anisotropic conductive film ACF is arranged to cover the terminal group OTMG consisting of a plurality of terminals OTM, both end portions of the anisotropic conductive film ACF in the longitudinal direction thereof (the parallel-arrangement direction of the terminals OTM) extend to and are formed on the solder resist film SR, and the anisotropic conductive film ACF is covered with the solder resist film SR in such extending portions. The solder resist film SR forms, as described previously, the opening OH for exposing the terminal group OTMG on the printed circuit board PCBh1.

As described above, the terminal OTM has the layer thickness of approximately 35 μm, for example, and hence, the terminal OTM has a relatively large stepped portion with respect to a surface of the printed circuit board PCBh1. Accordingly, the anisotropic conductive film ACF is arranged to traverse structural bodies which differ in height and hence, a possibility that the anisotropic conductive film ACF comes into contact with only the terminals OTM becomes high. Accordingly, the reliability of adhesion inevitably depends on the adhesiveness between the anisotropic conductive film ACF and the terminals OTM.

To compensate for such a structural disadvantage, according to the present invention, the solder resist film SR which exhibits favorable adhesiveness with the anisotropic conductive film ACF compared to the printed circuit board PCBh1 and the terminals OTM is arranged in the vicinity of end portions of the anisotropic conductive film ACF where the reliability of temporary fixing is liable to be most damaged. Due to such an arrangement of the solder resist film SR, the anisotropic conductive film ACF can easily come into contact with the solder resist film SR at the end portions of the terminal group OTMG thus enhancing the adhesiveness between the anisotropic conductive film ACF and the printed circuit board PCBh1.

The temporary fixing of the anisotropic conductive film ACF according to the present inventions is performed in a simple thermo-compression bonding step in which a tool is pressed to the anisotropic conductive film ACF on the printed circuit board PCBh1, the terminal group OTMG, and the solder resist film SR with a rubber sheet interposed therebetween at a relatively low temperature. Due to such a step, the anisotropic conductive film ACF is uniformly pressure-bonded to the printed circuit board PCBh1, the terminal group OTMG and the solder resist film SR and hence, the temporary fixing of the anisotropic conductive film ACF to the printed circuit board PCBh1 can be easily performed with reliability. Accordingly, after the temporary fixing, there is no possibility that the arrangement position of the anisotropic conductive film ACF with respect to the printed circuit board PCBh1 is changed and hence, the thermo-compression bonding of relatively high temperature for bonding the semiconductor device SCN to the printed circuit board PCBh1 which follows such a step can be performed with sufficient reliability.

Further, such an advantageous effect can be acquired by merely arranging the solder resist film SR on both end sides of the terminal group OTMG on the printed circuit board PCBh1. That is, such an advantageous effect can be acquired with the extremely simple constitution.

As shown in FIG. 1, a positioning mark MK is formed on the printed circuit board PCBh1 adjacent to a position where the anisotropic conductive film ACF is arranged. This positioning mark MK is used as a mark indicative of a reference position for accurately arranging the anisotropic conductive film ACF at the position shown in the drawing.

For automatically arranging the anisotropic conductive film ACF using an apparatus, the position of the anisotropic conductive film ACF is detected by a camera attached to the apparatus. The camera determines the arrangement position of the anisotropic conductive film ACF based on an image of the positioning mark MK detected when the camera moves in the direction indicated by an arrow a in the drawing.

The positioning mark MK is simultaneously formed using a material of the terminals OTM at the time of forming the terminals OTM, for example. Further, the positioning mark MK is formed in the inside of an opening OH1 formed in the solder resist film SR.

It is needless to say that it is not always necessary to perform the positioning of the anisotropic conductive film ACF with respect to the printed circuit board PCBh1 using the above-mentioned method. Accordingly, the above-mentioned positioning mark MK may not be formed on the printed circuit board PCBh1.

Other Embodiment

Figure 7:
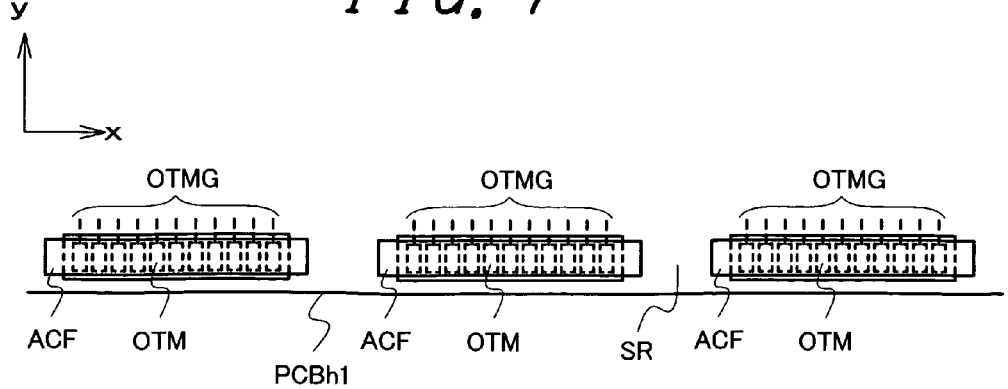
FIG. 7 is a plan view showing the arrangement relationship between respective terminal group of the printed circuit board and the anisotropic conductive film.

In the above-mentioned embodiment, for example, between the printed circuit board PCBh1 and the liquid crystal display panel PNL, the plurality of semiconductor devices SCN (video signal drive circuit HC1, HC2, . . . , HCi) is arranged in a striding manner. Accordingly, as shown in FIG. 7, on the printed circuit board PCBh1, a plurality of terminal groups OTMG is arranged in the x direction in the drawing with a gap between two respective terminal groups OTMG. Further, the anisotropic conductive film ACF is arranged to be allocated for every plurality of terminal groups OTMG, and is arranged to be divided (separated) from other anisotropic conductive films ACF.

The arrangement of the anisotropic conductive film ACF is not limited to such arrangements, and one (one sheet of) anisotropic conductive film ACF may be arranged to cover the respective terminal groups OTMG in common. However, by arranging the anisotropic conductive film ACF in a dividing manner as described above, the number of anisotropic conductive films ACF used in one liquid crystal display device can be largely decreased. Further, even when the anisotropic conductive film ACF is divided in such a manner, it is possible to perform the temporary fixing of the anisotropic conductive film ACF to the printed circuit board PCBh1 with sufficient reliability.

However, it is needless to say that the anisotropic conductive film ACF may be configured to cover the respective terminal groups OTMG in common.

Figure 8:
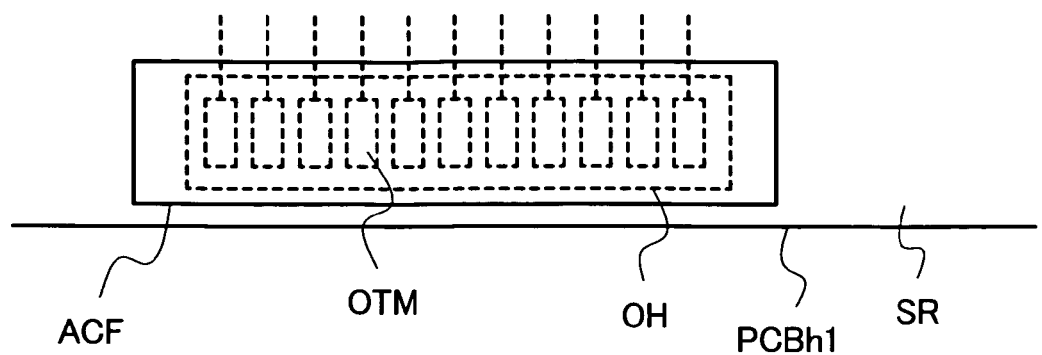
FIG. 8 is a constitutional view of an essential part showing another embodiment of a liquid crystal display device of the present invention.

In the above-mentioned embodiments, the anisotropic conductive film ACF arranged to cover the terminal group OTMG on the printed circuit board PCBh1 is configured to overlap with the solder resist film SR at both end portions thereof in the longitudinal direction. By overlapping at least both end portions of the anisotropic conductive film ACF in the longitudinal direction to the solder resist film SR, it is possible to acquire the advantageous effect of the present invention. Accordingly, it is needless to say that, as shown in FIG. 8, for example, both end portions (both side portions) of the anisotropic conductive film ACF in the lateral direction may overlap with the solder resist film SR.

In the above-mentioned embodiments, the explanation has been made mainly with respect to the connection between the printed circuit board PCBh1 and the video signal drive circuit HC1. However, it is needless to say that the present invention is applicable to the connection between the printed circuit board PCBh1 and other video signal drive circuit HC2, . . . , HCi, the connections between the respective printed circuit board PCBh2 and the video signal drive circuits HCi+1, . . . , HCm, or the connections between the printed circuit board PCBv and the respective scanning signal drive circuits VC1, VC2, . . . , Vcn.

The above-mentioned respective embodiments may be used in a single form or in combination. This is because advantageous effects of the respective embodiments can be acquired independently or synergistically.

What is claimed is:

1. A liquid crystal display device comprising:
a liquid crystal display panel;
a printed circuit board arranged close to the liquid crystal display panel; and
a semiconductor device arranged between the liquid crystal display panel and the printed circuit board in a striding manner, wherein
the semiconductor device includes a flexible printed circuit board and a semiconductor chip,
the flexible printed circuit board includes a plurality of first terminals connected to the printed circuit board and a plurality of second terminals connected to a liquid-crystal-display-panel side,
the printed circuit board includes a solder resist film, an opening portion formed in the solder resist film, and a terminal portion arranged in the opening portion and consisting of a plurality of terminals connected to the first terminals of the flexible printed circuit board,
the terminal portion of the printed circuit board and the first terminals of the semiconductor device are connected with each other by way of an anisotropic conductive film, and the anisotropic conductive film overlaps with at least the respective terminals of the terminal portion of the printed circuit board and the solder resist film, and
the opening portion formed in the solder resist film has a rectangular shape, the anisotropic conductive film has a rectangular shape, and a length of long sides of the anisotropic conductive film is larger than a length of long sides of the opening portion.

2. A liquid crystal display device according to claim 1, wherein the anisotropic conductive film has a rectangular shape, and a length of long sides and a length of short sides of the anisotropic conductive film are larger than a length of long sides and a length of short sides of the opening portion.

3. A liquid crystal display device according to claim 1, wherein a plurality of semiconductor devices is arranged between the liquid crystal display panel and the printed circuit board, and the anisotropic conductive film is arranged to be separated for every semiconductor device.

4. A liquid crystal display device according to claim 1, wherein a plurality of semiconductor devices is arranged between the liquid crystal display panel and the printed circuit board, and one anisotropic conductive film is arranged for the plurality of semiconductor devices.

5. A liquid crystal display device according to claim 1, wherein a plurality of semiconductor devices is arranged between the liquid crystal display panel and the printed circuit board, and the opening portion formed in the solder resist film is formed for every semiconductor device.

6. A liquid crystal display device according to claim 1, wherein a positioning mark for arranging the anisotropic conductive film is formed on the printed circuit board, and the positioning mark is formed close to the opening portion formed in the solder resist film.

7. A liquid crystal display device according to claim 6, wherein the positioning mark is formed in the inside of a second opening portion formed in the solder resist film.

8. A liquid crystal display device according to claim 7, wherein the second opening portion is formed in a circular shape.

\* \* \* \* \*